US012749875B1

(12) United States Patent
Chen

(10) Patent No.: US 12,749,875 B1
(45) Date of Patent: Sep. 29, 2026

(54) SYSTEMS AND METHODS FOR SEMICONDUCTOR OPTICAL AMPLIFIER INTEGRATION

(71) Applicant: CISCO TECHNOLOGY, INC., San Jose, CA (US)

(72) Inventor: Long Chen, Maynard, MA (US)

(73) Assignee: Cisco Technology, Inc., San Jose, CA (US)

(*) Notice: Subject to any disclaimer, the term of this patent is extended or adjusted under 35 U.S.C. 154(b) by 349 days.

(21) Appl. No.: 18/415,976

(22) Filed: Jan. 18, 2024

(51) Int. Cl.
*H01S 5/50* (2006.01)
*G02B 6/42* (2006.01)
*H01S 5/02253* (2021.01)
*H01S 5/026* (2006.01)

(52) U.S. Cl.
CPC .............. *H01S 5/50* (2013.01); *G02B 6/4214* (2013.01); *H01S 5/02253* (2021.01); *H01S 5/026* (2013.01)

(58) Field of Classification Search
CPC ........ H01S 5/50; H01S 5/02253; H01S 5/026; G02B 6/4214
USPC .......................................................... 359/344
See application file for complete search history.

(56) References Cited

U.S. PATENT DOCUMENTS 6,747,793 B1 * 6/2004 Flanders ............... H01S 5/4031 359/344
2018/0351684 A1 * 12/2018 Osenbach ......... H04J 14/02216

* cited by examiner

*Primary Examiner* — Daniel A Hess
(74) *Attorney, Agent, or Firm* — Patterson + Sheridan, LLP

(57) ABSTRACT

In one embodiment, the disclosure relates to a device that includes an optical input; an optical output; and an optical assembly having a length, a width, and a height The optical assembly includes an optical path, the optical path in optical communication with the optical input and the optical output; a semiconductor optical amplifier (SOA) array coupled to and powered by at least one electrical interconnect; a substrate layer in electrical communication with the at least one electrical interconnect; an optical lens array in optical communication with the optical path and the SOA; an optical isolator array; and a housing having at least one surface configured to redirect light between the optical input and the optical isolator array. The device is configured to receive and amplify an optical signal.

20 Claims, 4 Drawing Sheets

SYSTEMS AND METHODS FOR SEMICONDUCTOR OPTICAL AMPLIFIER INTEGRATION

FIELD

This disclosure relates generally to the field of photonic integrated circuits.

BACKGROUND

Contemporary optical communications and other photonic systems make extensive use of photonic integrated circuits that are advantageously mass-produced in various configurations for various purposes.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DESCRIPTION OF EXAMPLE EMBODIMENTS

Overview

Figure 1A:
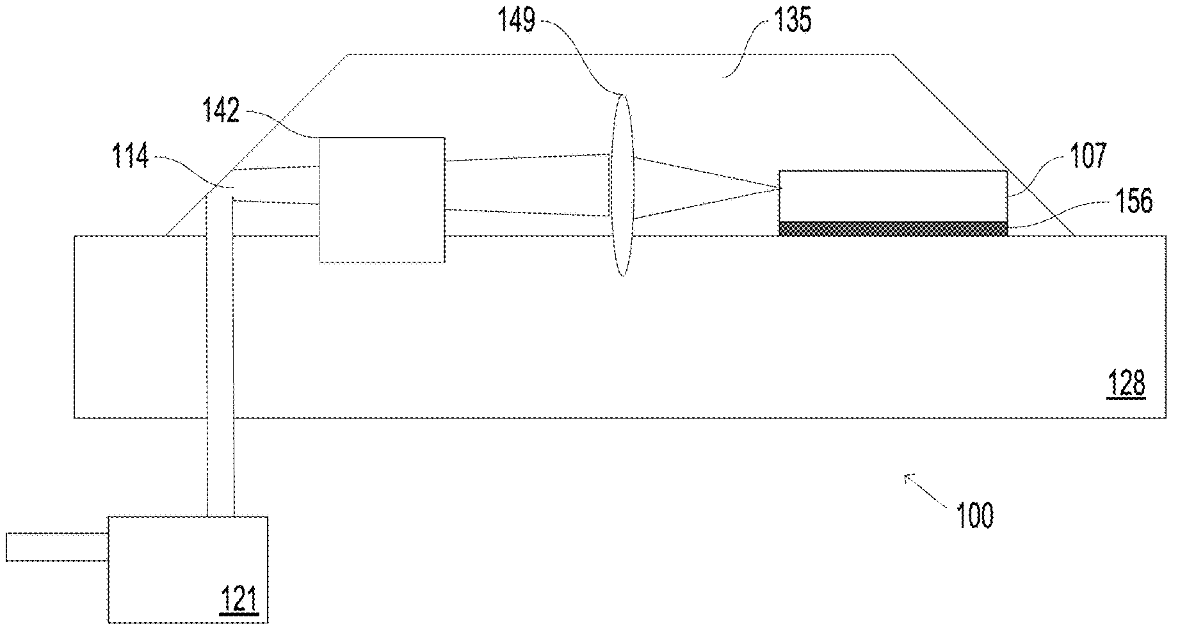
FIG. 1A is a side view diagram depicting a device that includes a loopback semiconductor optical amplifier according to an exemplary embodiment of the disclosure.

In part, the disclosure relates to a device that includes an optical input; an optical output; and an optical assembly having a length, a width, and a height The optical assembly includes an optical path, the optical path in optical communication with the optical input and the optical output; a semiconductor optical amplifier (SOA) array coupled to and powered by at least one electrical interconnect; a substrate layer in electrical communication with the at least one electrical interconnect; an optical lens array in optical communication with the optical path and the SOA; an optical isolator array; and a housing having at least one surface configured to redirect light between the optical input and the optical isolator array. The device is configured to receive and amplify an optical signal.

EXAMPLE EMBODIMENTS

In part, the disclosure relates to the design, creation, or implementation of micro-packaged semiconductor optical amplifiers and the integration of such device with photonic integrated circuit (PIC). Semiconductor optical amplifiers (SOA) are beneficial for the amplification and transmission of optical signals. In various embodiments, it is desirable to integrate a SOA onto a PIC with modulators using a micro-assembly that includes the SOA. Compared with alternative approach of separate SOA with fiber pigtails, integrating the SOA reduces costs associated with use of longer fiber pigtails, particularly polarization maintaining fiber pigtails. Further, SOA integration reduces the coupling loss as the SOA can directly interface into the photonic integrated circuit (PIC) instead of the interfacing the SOA with the optical fiber, and then the optical fiber with the PIC.

Typically, SOA integration has been accomplished by directly interfacing a SOA die onto a PIC. These implementation may rely on a variety of recess trenches, metallization, and mechanical stops. The recess trenches on an SOA die and mechanical stops are often designed together to provide vertical alignment between a waveguide on the SOA die and a waveguide on the PIC such that a straight though type SOA die can couple to the PIC waveguides on both facets. These implementation may utilize a lithographically defined chip edge so that the length of the SOA waveguide is properly match with the opening in the PIC waveguide. In similar implementations, a loopback SOA is utilized where the vertical alignment is configured for the SOA die can couple to the PIC waveguides on one facet.

These implementations are accompanied by several technical concerns. For instance, when the SOA is directly coupled to the waveguides on both input and output, mitigation of optical back reflections coming from the PIC is challenging. Additionally, since most SOA failures are associated with stress of the bonding, there is no way to burn-in the SOA die without potentially sacrificing the entire PIC die. Further, assembly proves difficult due to strict requirements in wafer cleanliness and precision bonding. Integration of the SOA must be early in the assembly process. Integrating an SOA die on the PIC may not be feasible if a through silicon via (TSV) is also implemented. In various embodiments, the SOA is a pass-through optical amplifier. In various embodiments, the SOA is configured to receive and amplify multiple optical channels.

The present disclosure provides an alternative solution that involves building the SOA into a micro-subassembly, and attaching the subassembly to the PIC. The present disclosure would not require post-process steps on the main PIC. In various embodiments, the device can be assembled on the wafer level, fully tested before separation and attachment to the PIC. In various embodiments, the SOA micro-subassembly can be implemented onto the substrate of the PIC with a through-silicon via (TSV), through-chip via or other via technology. In some embodiments, the optical path is directed through a via of a substrate such as silicon, which may be part of or disposed on a PIC. In various embodiment, a PIC may include one or more modulators and one or more waveguides. In many embodiments, a micro-assembly comprising an SOA, an isolator, and a lens are formed and the micro-assembly is disposed on, connected to, coupled, or in optical communication with the PIC. In various embodiments, the housing of the devices disclosed herein may be disposed on or in the PIC or otherwise in optical communication with one or more waveguides of the PIC.

Refer now to the example embodiment of FIG. 1A. FIG. 1A shows a side view of a device 100 that includes a loopback SOA 107. In various embodiments, the optical path 114 enters through a source such as a grating coupler array 121 and is redirected along optical path 114 through various components in optical communication as shown. The optical path 114 passes through a substrate layer 128, until it reflects from the housing's reflector or reflective surface, which may be a surface or component of the lid of housing (such as an optical housing) to a direction nearly parallel with the substrate layer 128. The substrate 328 may be made of silicon or glass and may contain various layers for electrical routing and optical anti-reflection. In various embodiments, a lid or housing 135 includes a reflector or a reflective surface or facet to reflect and direct light through a group of optical elements that are components of the micro-assembly. The optical components are disposed along the optical path 114. Note that the optical path 114 may be slightly off from normal incidence to substrate 128 to avoid undesired optical back reflection at the interfaces.

In some embodiments, the lid or housing 135 defines a cavity that includes various optical components and the optical path. The lid or housing may be an optical housing that includes one or more reflective surfaces or facets designed to redirect light along the optical path. In some embodiments, the one or more reflective surfaces or facets may include a metal coating such as gold or another material to improve reflections. In various embodiments, the angle the light is reflected and redirected may vary depending on the orientation of components in particular embodiments. The optical path 114 will then travel through an optical isolator array 142 and into an optical lens array 149. The optical lens array 149 redirects the optical path 114 into the optical facet of the loopback SOA 107.

In various embodiments, the loopback SOA 107 amplifies the light traveling in the optical path 114 when it enters the SOA 107. Within the loopback SOA 107 the optical path 114 may travel in a variety of paths until exiting through the same optical facet it entered. The optical path 114 will then travel through the optical lens array 149, and the optical isolator array 142, until it is redirected by the a lid or housing 135 towards the grating coupler array 121 where it is then redirected to a waveguide of a PIC. In some embodiments, the housing is an optical housing such that the optical housing includes one or more reflective surfaces, facets, walls, or other light scattering, focusing, diverging, or reflecting surfaces or other surfaces that change light entering or passing through it. The optical housing may include one or more reflective surfaces. The reflective surfaces may direct and reflect light along various optical paths.

Figure 1B:
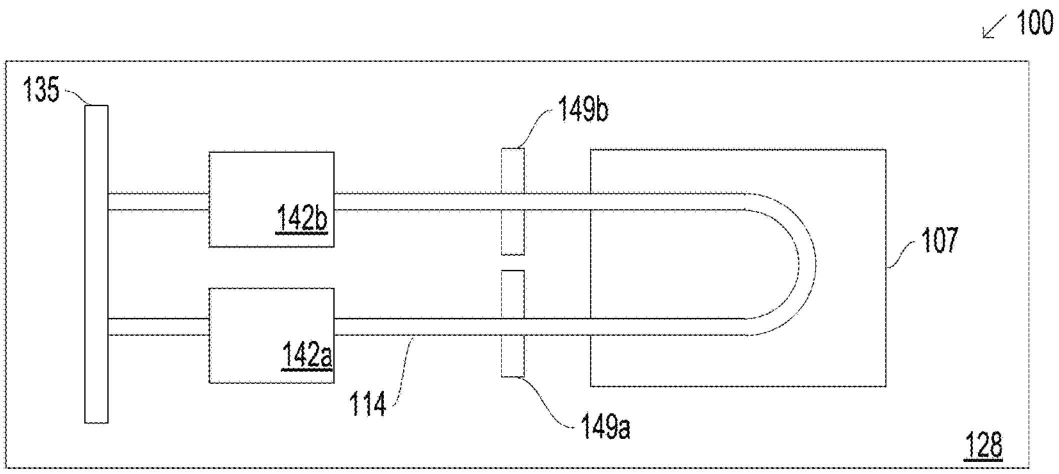
FIG. 1B is a top view diagram depicting the single-channel of the device of FIG. 1A according to an exemplary embodiment of the disclosure.

Refer now to the example embodiment of FIG. 1B. FIG. 1B shows a top view of the single-channel of the device 100 as depicted in FIG. 1A. In various embodiments, the optical path 114 is reflected off of the edge of the lid or housing 135. It then travels through an input optical isolator 142*a* and into the input optical lens 149*a*. The optical path 114 enters the loopback SOA 107 through an optical facet. The loopback SOA 107 will receive light in its optical facet, amplify the light, and output the light through the same optical facet along the optical path 114. The light is then amplified in the loopback SOA 107. In various embodiments, the optical path 114 could travel in a variety of different directions in the loopback SOA 107. The optical path 114 then exits the loopback SOA 107 through the same optical facet it entered. The optical path 114 then travels through the output optical lens 149*b*, the output optical isolator 142*b*, and is reflected by a reflector that may be a standalone reflector or a reflective surface of the lid or housing 135. The light continues to travel along the optical path 114 as depicted in FIG. 1A. In various embodiments, the light may couple back to an output waveguide on the PIC via an output grating coupler as part of the grating coupler array 121. The grating coupler array may include plurality of waveguide layers.

In various embodiments, the loopback SOA 107 is connected to the substrate layer 128 by an electric interconnect 156. In various embodiment the electrical interconnect 156 provides power to the loopback SOA 107. In various embodiments, there is not a lid or housing 135 but a reflective surface positioned to redirect the optical path 114.

In various embodiments, the grating coupler array 121 includes at least twice as many grating couplers as there are optical channels in the device 100. In various embodiments, the grating coupler array 121 includes two grating couplers, an input grating coupler, and an output grating coupler. In various embodiments, the input grating coupler is aligned with the output grating coupler. In various embodiments, the input grating coupler is not aligned with the output grating coupler. In various embodiments, the optical path 114 leaving the output grating coupler is parallel to the optical path 114 into the input grating coupler. In various embodiments, the optical path 114 leaving the output grating coupler is not parallel to the optical path 114 into the input grating coupler. In various embodiments, the input grating coupler receives the incoming optical path 114 at a different height than the outgoing optical path 114 from the output grating coupler after the optical path travels through the device 100.

In various embodiments, the optical isolator array 142 includes at least twice as many optical isolators as there are optical channels in the device 100. In various embodiments, the optical isolator array 142 may be a single isolator block that is shared between the input portion and output portion of one optical channel or optical path, or between more than one optical channels.

The optical lens array 149 may include various types of lenses, such as for example, silicon lenses or ball lenses. Other lenses and refracting and diffracting elements may be used along or as part of a lens array without limitation. In various embodiments, the optical lens array 149 includes lenses about 100 μm to 500 μm thick. In various embodiments, the optical lens array 149 includes multiple separate lenses, while in other embodiments the optical lens array 149 is one continuous component. In many embodiments, the optical lens array 149 includes at least twice as many optical lenses as there are optical channels in the device 100.

Figure 2A:
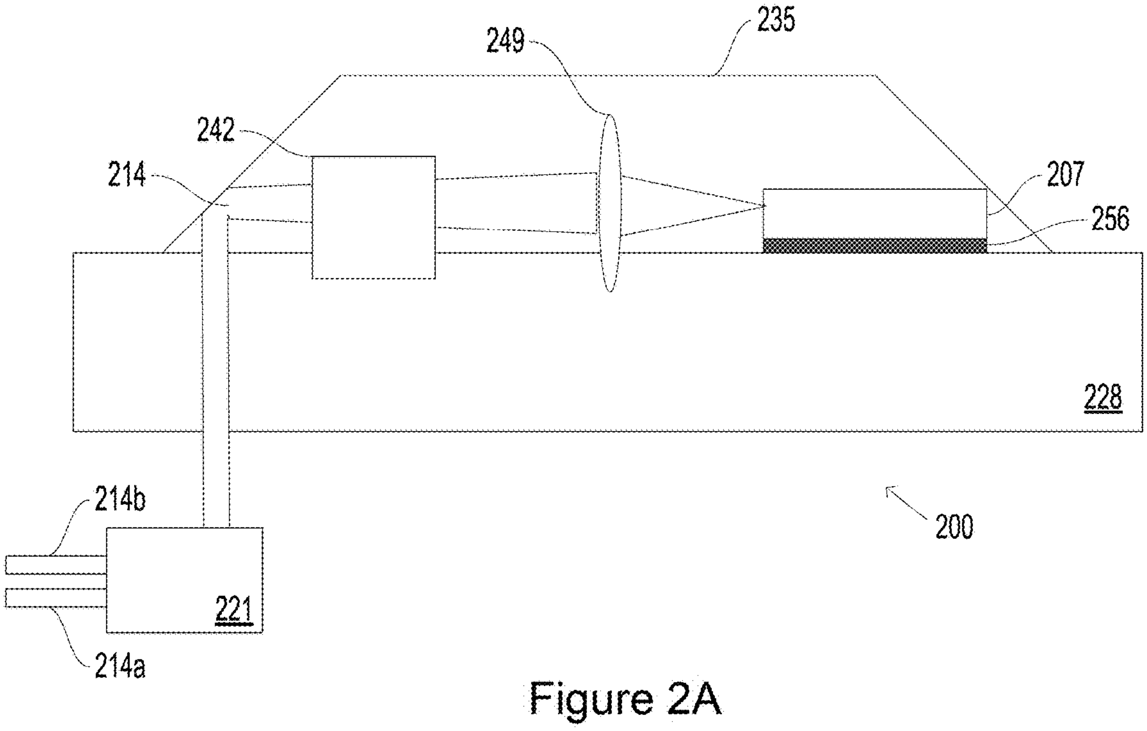
FIG. 2A is a side view diagram depicting a device that includes a loopback semiconductor optical amplifier according to an exemplary embodiment of the disclosure.

Refer now to the example embodiment of FIG. 2A. FIG. 2A shows the side view of a dual channel device 200 that includes a loopback SOA array 207. A first optical path 214*a* and a second optical path 214*b* travel through a grating coupler array 221. The plurality of optical paths 214*a*, 214*b* continue to travel in a largely parallel optical path 214 through a substrate layer 228, and are incident on the lid or housing 235. After being reflected to a direction nearly parallel with the substrate layer 128, the optical path 414 travels through the optical isolator array 242 and an optical lens array 249 until reaching the optical facets of the loopback SOA array 207. One or more of the loopback SOAs may receive light in their optical facet, amplify the light, and output the light through the same optical facet along the optical path 214. The optical path then travels through the optical lens array 249, the optical isolator array 242, until it is incident on the lid or housing 235. The lid or housing redirects the optical path through the substrate layer 228, and into the grating coupler array 221. The first optical path 214*a* and second optical path 214*b* will exit the coupler array 221.

In various embodiments, the loopback SOA assembly 207 is connected to the substrate layer 228 by at least one electric interconnect 256. An electrical interconnect 256 or other electrical connector or coupler may be used to provide power to the loopback SOA 207. In various embodiments, there is not a lid or housing 235 but a reflective surface positioned to redirect the optical path 214.

In various embodiments, the first optical path 214*a* and the second optical path 214*b* may enter and exit the device 200 through the grating coupler array 221 in staggered positions. In various embodiments, the first optical path 214*a* and second optical path 214*b* may enter and exit the device 200 through the coupler array 221 from a variety of angles. In various embodiments, the first optical path 214*a* and second optical path 214*b* may enter and exit the device 200 through the grating coupler array 221 along a largely parallel path. In various embodiments, the light travels along a different optical path when entering the device 200 than the light travels along when it exits the device 200 through the coupler array 221 where it is then redirected towards a plurality of waveguides of a PIC. In various embodiments, a given SOA-based device may have light entering one side and exiting another. The input and output sides of a given SOA-based device may be reversed in various embodiments. In some embodiments, the PIC includes one or more optical paths. The one or more optical paths are in optical communication with the SOA or other optical elements of the devices disclosed herein.

Figure 2B:
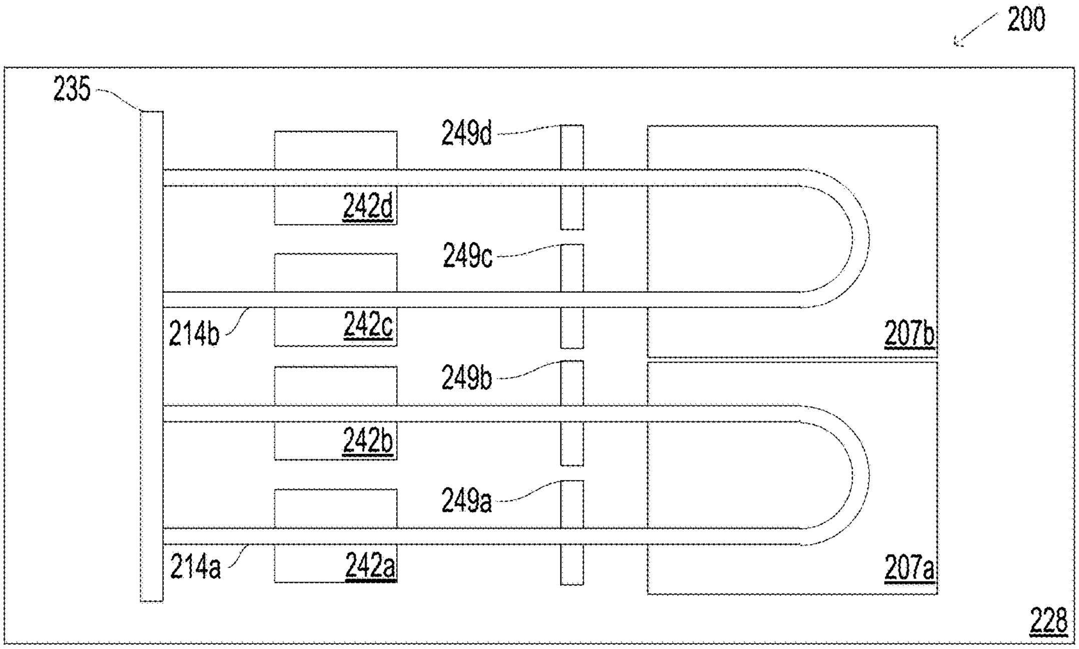
FIG. 2B is a top view diagram depicting the dual-channel of the device of FIG. 2A according to an exemplary embodiment of the disclosure.

Refer now to the example embodiment of FIG. 2B. FIG. 2B shows the top view of a dual-channel device 200 that includes a loopback SOA array 207 as depicted in FIG. 2A. The first optical path 214*a* is reflected off the edge of the lid or housing 235. The first optical path 214*a* then continues through an input optical isolator 242*a*, an input lens 249*a*, and into the first loopback SOA 207*a* through an optical facet. The first optical path 214*a* then leaves through an output lens 249*b*, output optical isolator 242*b*, and is reflected by the lid or housing 235. In various embodiments, one or more optical isolators, lens, and SOAs may the components used in a given micro-assembly.

In some embodiments, the second optical path 214*b* follows a largely parallel path to the first optical path 214*a*. The second optical path 214*b* is reflected off the edge of the lid or housing 235. The second optical path 214*b* then continues through an input optical isolator 242*c*, an input lens 249*c*, and into the first loopback SOA 207*b* through an optical facet. The second optical path 214*b* then leaves through an output lens 249*d*, output optical isolator 242*d*, and is reflected by the lid or housing 235. After being reflected by the lid or housing 235, the light continues to travel along the optical paths 214*a*, 214*b* as depicted in FIG. 2A.

In various embodiments, more than two optical channels may be implemented. In various embodiments, the number of loopback SOAs in the loopback SOA array 207 is equal to the number of optical channels. In various embodiments, there are at least twice as many grating couplers in the grating coupler array 221, at least twice as many optical isolators in the optical isolator array 242, and at least twice as many lenses in the optical lens array 249 as there are loopback SOAs in the loopback SOA array 207, such that each optical channel has an input grating coupler, an input optical isolator, an input optical lens an output grating coupler, an output optical isolator, and an output optical lens.

Figure 3A:
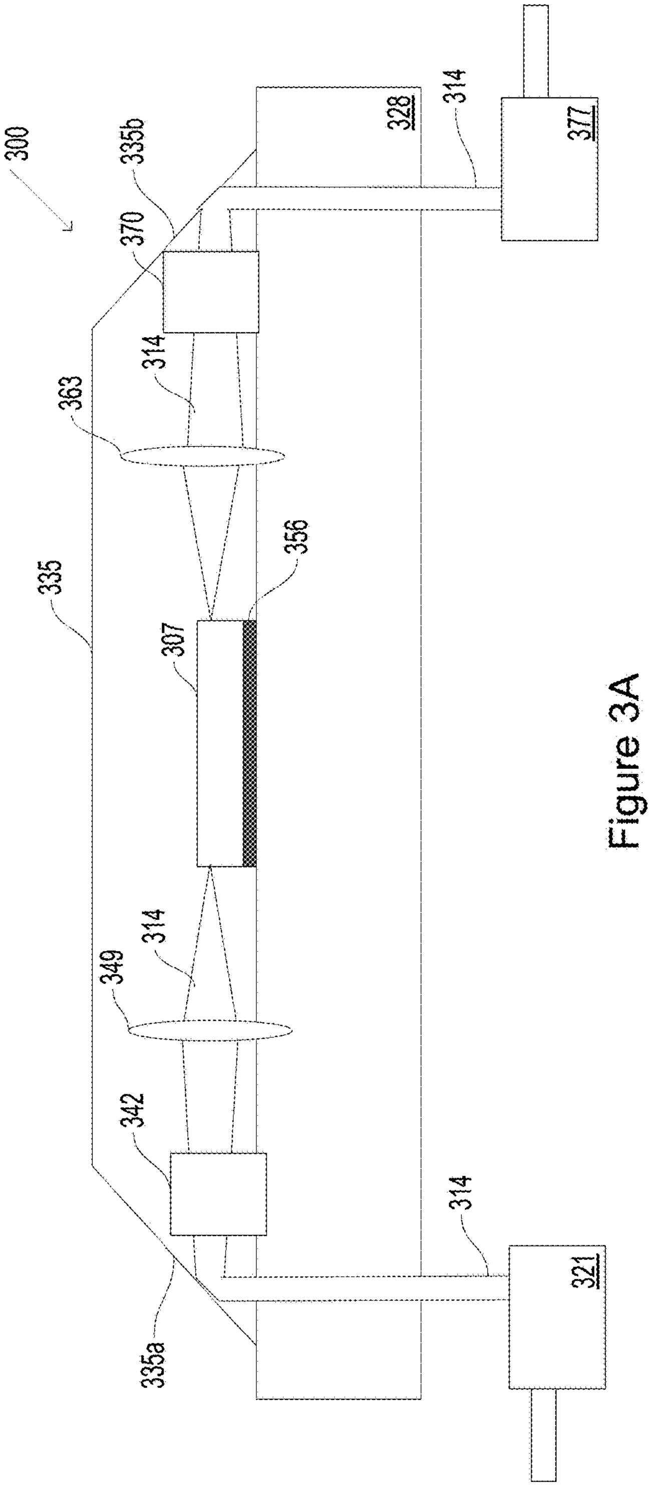
FIG. 3A is a side view diagram depicting a device that includes a straight through semiconductor optical amplifier according to an exemplary embodiment of the disclosure.

Refer now to the example embodiment of FIG. 3A. FIG. 3A shows a side view of a device 300 that includes a straight through SOA 307 in which light enters on one side is amplified in the middle by SOA 307 and amplified light is then transmitted from the other side. In various embodiments, the optical path 314 enters through an input coupler array 321, and is redirected towards the rest of the device 300. The optical path 314 then passes through a substrate 328 until it is redirected off a first reflector 335*a* of the lid or housing 335. The substrate 328 may be made of silicon layer. In various embodiments, the substrate 328 may be part of a PIC. In various embodiments, the angle the optical path 314 is redirected may vary depending on the orientation of components in particular embodiments. The optical path 314 will then travel through an input optical isolator 342 and an input lens 349 until entering the straight through SOA 307 through an input optical facet. The straight through SOA 307 will receive light in their input optical facet, amplify the light, and output the light through their output optical facet along the optical path 314. The light may travel along a variety of different paths within the straight through SOA 307 until it is output through an output optical facet. After being output by the straight though SOA 307 the optical path 314 will travel through an output lens 363 and then through the output optical isolator 370. The optical path 314 will then be redirected at about 90 degrees by the second reflector 335*b* of the lid or housing 335. The optical path will travel through the substrate 328 towards the output coupler array 377 where it is then redirected towards a plurality of waveguides of a PIC.

In various embodiments, the straight through SOA 307 is connected to the substrate 328 by an electric interconnect 356. In various embodiment the electrical interconnect 356 provides power to the straight through SOA 307. In various embodiments, a reflective surface or a reflector is positioned within the lid or housing 335 to redirect the light along optical path 314.

Figure 3B:
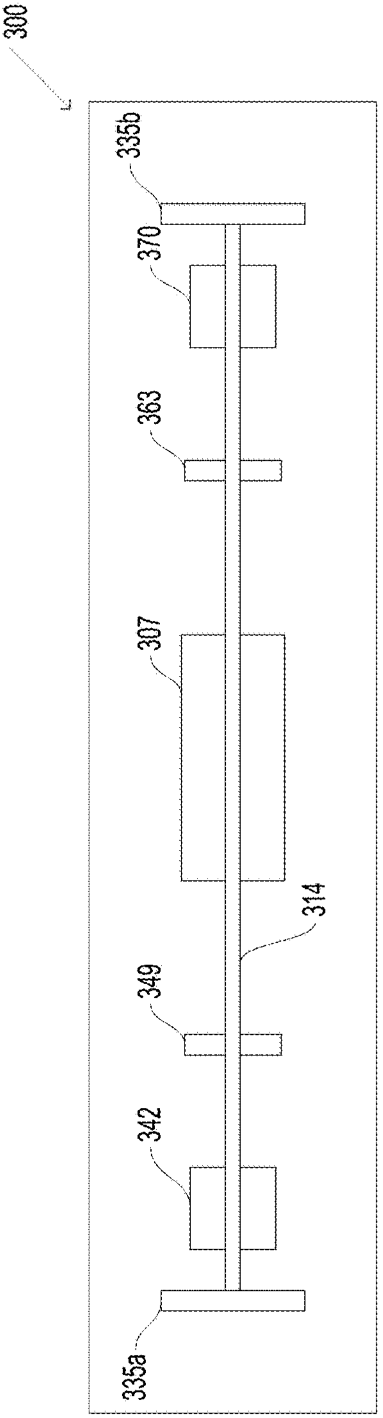
FIG. 3B is a top view diagram depicting the single-channel of the device of FIG. 3A according to an exemplary embodiment of the disclosure.

Refer now to the example embodiment of FIG. 3B. FIG. 3B shows a top view of a single-channel of the device 300 as depicted in FIG. 3B. In various embodiments, the optical path 314 is directed by the first reflector 335*a* of the lid or housing 335 or a separate reflector that is not part of the lid or housing. The optical path then travels through an input optical isolator 342 and into the input lens 349. The light traveling the optical path 114 enter the straight through SOA 307 through input optical facet, and exits through the output optical facet. While in the straight through SOA 307 the light is amplified. The light on the optical path 314 then travels through the output lens 363, output optical isolator 370, and is reflected by the second reflector 335*b* of the lid or housing 335. The light will then continue to travel along the path as depicted in FIG. 3A.

Figure 4A:
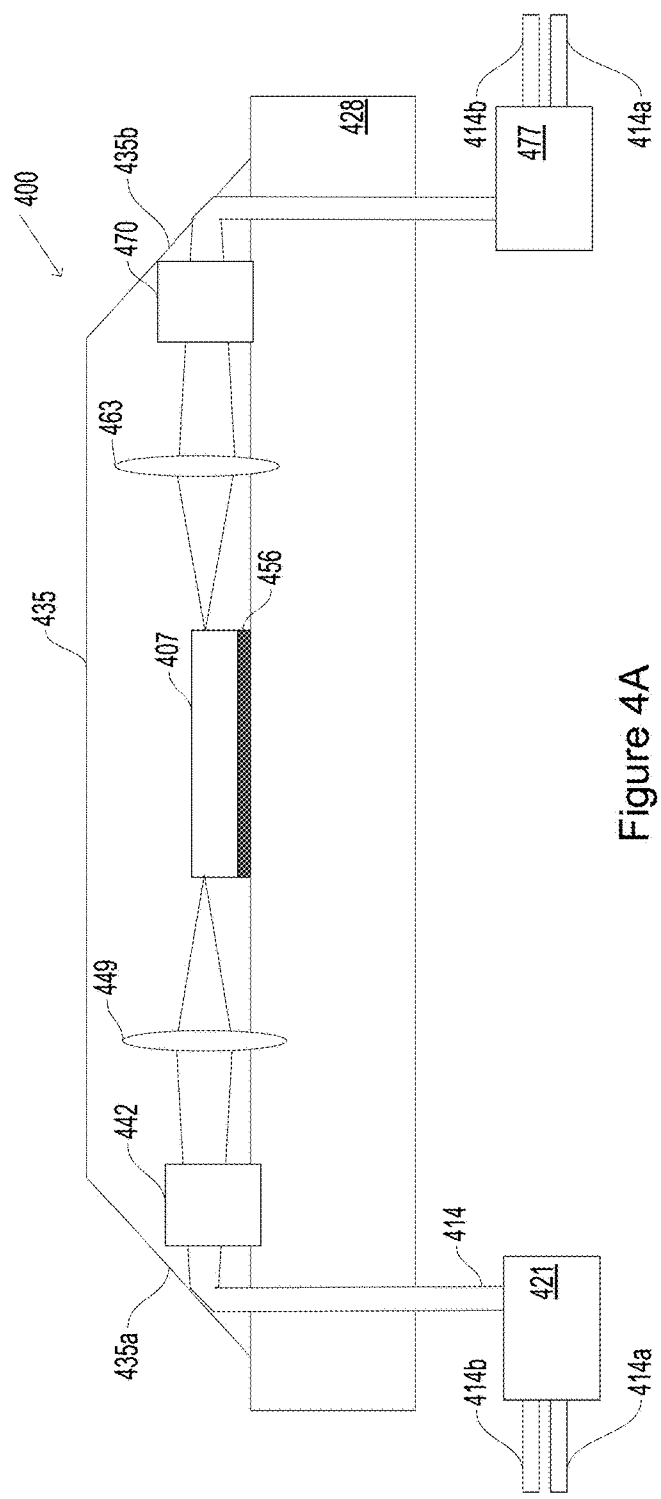
FIG. 4A is a side view diagram depicting a device that includes a straight through semiconductor optical amplifier according to an exemplary embodiment of the disclosure.

Refer now to the example embodiment of FIG. 4A. FIG. 4A shows the side view of a dual channel device 400 that includes a straight through SOA array 407. A first optical path 414*a* and a second optical path 414*b* travel through an input grating coupler array 421. The plurality of optical paths 414*a*, 414*b* continue to travel in a largely parallel optical path 414 through a substrate layer 228, and are then incident on the first reflector 435*a* of the device housing 435. After being redirected to largely parallel with the substrate layer 228, the optical path 414 travel through an input optical isolator array 442, and an input optical lens array 449, until entering the input optical facets of the straight through SOA array 407. The straight through SOA array 407 includes at least one straight through SOA for each optical channel. Each one of the straight through SOAs will receive light in their input optical facet, amplify the light, and output the light through their output optical facet along the optical path 414.

For some configurations, after exiting the straight through SOA array 407, the optical path 414 will continue through an output optical lens array 463, an output optical isolator array 470 until it is incident on the second reflector 435*b* of the device housing 435. The second reflector 435*b* of the device housing will redirect the optical path through the substrate layer 428 and towards the coupler grating array 477. The first optical path 414*a* and second optical path 414*b* will exit the output coupler array 477. In various embodiments, the first optical path 414*a* and second optical path 414*b* may enter and exit the device 400 through the coupler arrays 421, 477 from a variety of angles. In various embodiments, the first optical path 414*a* and second optical path 414*b* may enter and exit the device 400 through the coupler arrays 421, 477 along a largely parallel path.

In various embodiments, the straight through SOA array 407 is connected to the substrate 428 such as a silicon layer by at least one electric interconnect 456. In various embodiment the electrical interconnect 456 provides power to the straight through SOA array 407. In various embodiments, a reflective surface or a reflector is positioned within the lid or housing 435 to redirect the light along optical path 414.

Figure 4B:
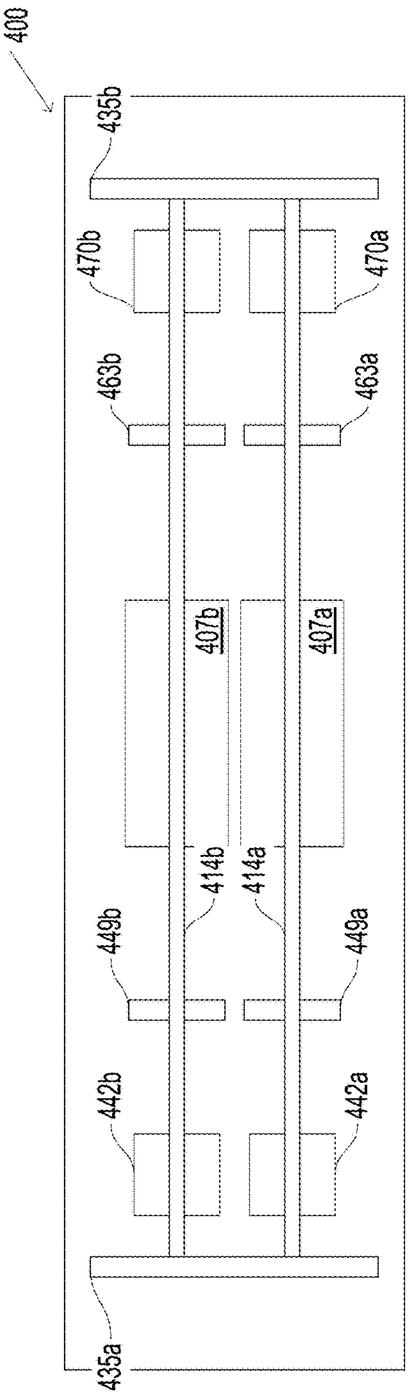
FIG. 4B is a top view diagram depicting the dual-channel of the device of FIG. 4A according to an exemplary embodiment of the disclosure.

Refer now to the example embodiment of FIG. 4B. FIG. 4B shows the top view of a dual-channel device 400 that includes a straight through SOA array 407 as depicted in FIG. 4A. The first optical path 414*a* is redirected by the first reflector 435*a* of the lid or housing. The first optical path 414*a* then continues through an input optical isolator 442*a*, an input lens 449*a*, and in the input optical facet of the first straight through SOA 407*a*. The first straight through SOA 407*a* will amplify the light traveling along the first optical path 414*a* until it outputs the light through an output optical facet. The first optical path 414*a* then travels through an output lens 463*a*, output optical isolator 470*a*, and is redirected by the second reflector 435*b* of the lid or housing. The second optical path 414*b* follows a largely parallel path to the first optical path 414*a*. The second optical path 414*b* is redirected by the first reflector 435*a* of the lid or housing. The second optical path 414*b* then continues through an input optical isolator 442*b*, an input lens 449*b*, and in the input optical facet of the second straight through SOA 407*b*. The second straight though SOA 407*b* will amplify the light traveling along the second optical path 414*b* until it outputs the light through an output optical facet. The second optical path 414*b* then travels through an output lens 463*b*, output optical isolator 470*b*, and is redirected by the second reflector 435*b* of the lid or housing. After being reflected by the second reflector 435*b* of the lid or housing, the light continues to travel along the optical paths 414*a*, 414*b* as depicted in FIG. 4A.

In various embodiments, more than two optical channels may be implemented. In various embodiments, the number of straight through SOAs in the straight through SOA array 407 is equal to the number of optical channels. In various embodiments, there are at least twice as many grating couplers, at least twice as many optical isolators, and at least twice as many lenses, as there are straight through SOAs in the straight through SOA array 407, such that each optical channel has an input grating coupler, an input optical isolator, an input optical lens an output grating coupler, an output optical isolator, and an output optical lens.

A person of ordinary skill will appreciate various tradeoffs involved in implementations utilizing straight through SOAs instead of loopback SOAs. For example, a device that utilizes a straight through SOA requires sensitive dimensional control, while a device that utilizes a loopback SOA does not have the same sensitivity due to the singular optical facet per SOA, but loopback SOAs are more complicated to manufacture. Additionally, the spatial demands of the apparatus may inform whether a loopback SOA or a straight through SOA is preferred for a given design.

In various embodiments, the grating couplers only need to work with one polarization resulting in very high peak coupling efficiency. In various embodiments, the peak coupling efficiency can be about 1 dB. In various embodiments, the wavelength of interest could be a relatively narrow range, for example, within about 20 nm.

In various embodiments, the loopback SOA chip length will be about 0.5 mm to about 1.5 mm. The length of the housing or optical assembly may be between 3 and 5 mm. The width of the housing or optical assembly may be between 1 mm and 3 mm. The height of the housing or assembly may be 0.3 mm and 1 mm. In various embodiments, the lid or housing is made of silicon or other semiconductor material. In some embodiments, the lid or housing has a rectangular shape. In many embodiments, the lid or housing has a trapezoidal cross-sectional profile. The lid or housing may define one or more bevels or facets. The bevels or facets may be reflective or light directing surfaces. In various embodiments, the width, length, and height of the optical assembly may be referenced as the assembly width, an assembly length, and an assembly height, respectively. The optical assembly is a micro-packaged optical assembly in various embodiments.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase “and/or,” as used herein in the specification and in the claims, should be understood to mean “either or both” of the elements so conjoined, i.e., elements that are conjunctively present in some cases and disjunctively present in other cases.

As used herein in the specification and in the claims, the phrase “at least one,” in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

The invention claimed is:

1. A device comprising:

an optical input;

an optical output; and an optical assembly having a length, a width, and a height, the optical assembly comprising:

an optical path, the optical path in optical communication with the optical input and the optical output;

a semiconductor optical amplifier (SOA) array coupled to and powered by at least one electrical interconnect;

a substrate layer in electrical communication with the at least one electrical interconnect;

an optical lens array in optical communication with the optical path and the SOA array;

an optical isolator array; and a housing having at least one surface configured to redirect light between the optical input and the optical isolator array;

wherein the device is configured to receive and amplify an optical signal.

2. The device of claim 1, wherein the optical input is a grating coupler array.

3. The device of claim 1, wherein the length ranges from about 3 mm to about 5 mm.

4. The device of claim 3, wherein the width ranges from about 1 mm to about 3 mm.

5. The device of claim 4, wherein the height ranges from about 0.3 mm to about 1 mm.

6. The device of claim 5, wherein the optical assembly is a micro-packaged optical assembly.

7. The device of claim 1, wherein the SOA array is a loopback semiconductor optical amplifier.

8. The device of claim 1, wherein the SOA array is a pass-through optical amplifier.

9. The device of claim 1, wherein the SOA array is configured to receive and amplify multiple optical channels.

10. The device of claim 1, wherein the optical output is a grating coupler array.

11. The device of claim 10, wherein the grating coupler array comprises a plurality of waveguide layers.

12. The device of claim 1, wherein the housing is an optical housing.

13. The device of claim 12, wherein the optical housing comprises one or more reflective surfaces.

14. The device of claim 1, wherein the optical assembly is a micro-packaged optical assembly.

15. The device of claim 14 further comprising: a photonic integrated circuit (PIC), wherein the PIC comprises one or more optical paths, wherein the one or more optical paths are in optical communication with the SOA array, wherein the housing is disposed on a portion of the PIC.

16. A device comprising:

a micro-packaged optical assembly comprising:

at least one loopback semiconductor optical amplifier (SOA) having one optical facet that is configured to receive and output light;

an optical lens array, and an optical isolator array that includes an input optical isolator and an output optical isolator, wherein the optical lens array is configured to direct light between the input optical isolator, the loopback SOA and the output optical isolator;

wherein the device is integrated with and configured to receive light from a photonic integrated circuit, wherein the micro-packaged optical assembly has an assembly width, an assembly length, and an assembly height.

17. The device of claim 16, wherein the assembly length ranges from about 3 mm to about 5 mm.

18. The device of claim 17, wherein the assembly width ranges from about 1 mm to about 3 mm.

19. The device of claim 18, wherein the assembly height ranges from about 0.3 mm to about 1 mm.

20. The device of claim 19 further comprising: a photonic integrated circuit (PIC), wherein the PIC comprises one or more optical paths, wherein the one or more optical paths are in optical communication with the loopback SOA, wherein the micro-packaged optical assembly is disposed on a portion of the PIC.

* * * * *